(12) United States Patent
Shimizu

(10) Patent No.: US 8,928,803 B2
(45) Date of Patent: Jan. 6, 2015

(54) SOLID STATE APPARATUS

(71) Applicant: Canon Kabushiki Kaisha, Tokyo (JP)

(72) Inventor: Koichi Shimizu, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 13/676,536

(22) Filed: Nov. 14, 2012

(65) Prior Publication Data

US 2013/0141606 A1 Jun. 6, 2013

(30) Foreign Application Priority Data

Dec. 1, 2011 (JP) ................................. 2011-264114

(51) Int. Cl.
| | |
|---|---|
| *H04N 5/225* | (2006.01) |
| *H01L 27/146* | (2006.01) |
| *H01L 31/02* | (2006.01) |
| *H01L 31/0203* | (2014.01) |
| *H04N 5/232* | (2006.01) |
| *H01L 23/00* | (2006.01) |

(52) U.S. Cl.
CPC ...... *H01L 31/0203* (2013.01); *H01L 27/14618* (2013.01); *H01L 2924/3511* (2013.01); *H01L 2224/48091* (2013.01); *H01L 2224/97* (2013.01); *H01L 31/02016* (2013.01); *H01L 2224/48227* (2013.01); *H01L 2924/15311* (2013.01); *H04N 5/23229* (2013.01); *H01L 2224/8592* (2013.01); *H01L 24/97* (2013.01)
USPC ........................................................ 348/374

(58) Field of Classification Search
CPC ............. H04N 5/23229; H04N 5/2253; H01L 31/0203; H01L 31/02016
USPC ............................................................ 348/374
See application file for complete search history.

(56) References Cited

U.S. PATENT DOCUMENTS

| | | | | |
|---|---|---|---|---|
| 6,383,835 | B1 | 5/2002 | Hata et al. | ........................ 438/65 |
| 7,183,589 | B2 * | 2/2007 | Kameyama et al. | ........... 257/100 |
| 7,998,781 | B2 * | 8/2011 | Uchida et al. | .................... 438/66 |
| 2008/0224333 | A1 * | 9/2008 | Fukasawa | ...................... 257/787 |
| 2009/0022949 | A1 * | 1/2009 | Horita et al. | ..................... 428/138 |
| 2009/0315164 | A1 * | 12/2009 | Chow et al. | .................... 257/680 |
| 2013/0137259 | A1 * | 5/2013 | Bieck et al. | ..................... 438/612 |

FOREIGN PATENT DOCUMENTS

| | | |
|---|---|---|
| JP | 9-129780 A | 5/1997 |
| JP | 2009-152481 A | 7/2009 |

* cited by examiner

*Primary Examiner* — James Hannett
(74) *Attorney, Agent, or Firm* — Fitzpatrick, Cella, Harper & Scinto

(57) ABSTRACT

A solid state apparatus comprising, a printed circuit board having a first and a second surface that are opposite surfaces, a semiconductor chip for imaging arranged on the first surface, a sealing resin arranged to cover the printed circuit board and the semiconductor chip, and a translucent member arranged on the sealing resin, the solid state apparatus having a first region located inward of an outer edge of the semiconductor chip, and a second region located outward of the outer edge, the printed circuit board comprising, on the first surface, a first terminal electrically connected to the semiconductor chip, and comprising, on the second surface, a second terminal electrically connected to the first terminal within the printed circuit board, the second terminal being arranged in the first region.

9 Claims, 9 Drawing Sheets

F I G. 5A
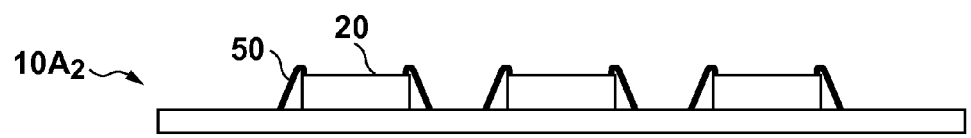
F I G. 5B
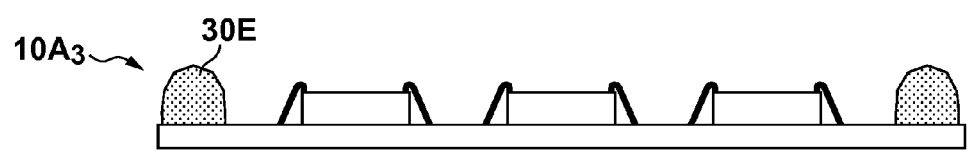
F I G. 5C
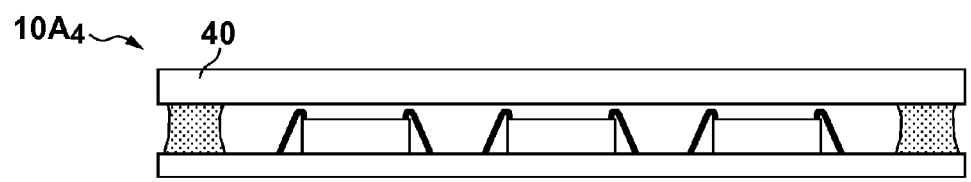
F I G. 5D
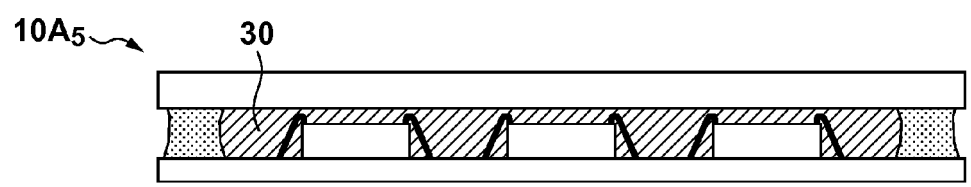
F I G. 5E
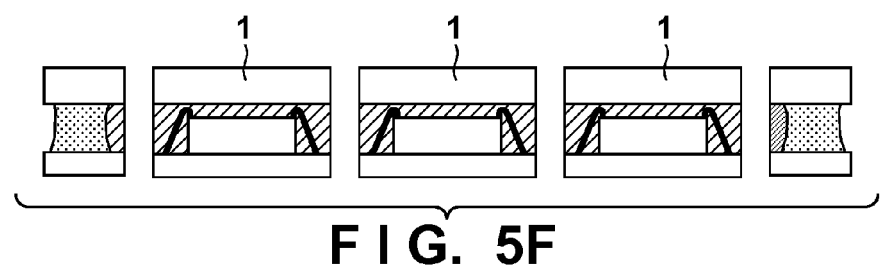
F I G. 5F

SOLID STATE APPARATUS

BACKGROUND OF THE INVENTION

1. Field of the Invention

The present invention relates to solid state apparatuses.

2. Description of the Related Art

Japanese Patent Laid-Open Nos. 09-129780 and 2009-152481 disclose a solid state apparatus provided with a semiconductor chip for imaging arranged on a printed circuit board, sealing resin arranged to cover them, and a translucent member arranged on the sealing resin. This solid state apparatus is then fixed to and thus mounted on a mounting board by means of solder, for example.

Such a solid state apparatus is subjected to stress due to change in the environment such as, for example, temperature or humidity, and its translucent member is possibly distorted. Within the solid state apparatus, the thickness of the sealing resin below the translucent member differs in some regions, and the above-mentioned stress occurs due to the difference in variations of the volume of the sealing resin among the respective regions. The distortion of the translucent member occurring for that reason can cause image distortion or focus shift at the time of imaging, and the optical accuracy can deteriorate. Moreover, such distortion causes problems of electrical contact such as a short circuit or a break in a thin line that connects the printed circuit board to the semiconductor chip, resulting in lower reliability.

SUMMARY OF THE INVENTION

The present invention provides a solid state apparatus that is advantageous in improving optical accuracy and reliability.

One of the aspects of the present invention provides a solid state apparatus comprising, a printed circuit board having a first surface and a second surface that are opposite surfaces, a semiconductor chip for imaging arranged on the first surface of the printed circuit board, a sealing resin arranged to cover the printed circuit board and the semiconductor chip, and a translucent member arranged on the sealing resin, the solid state apparatus having a first region located inward of an outer edge of the semiconductor chip, and a second region located outward of the outer edge, the printed circuit board comprising, on the first surface, a first terminal electrically connected to the semiconductor chip, and comprising, on the second surface, a second terminal electrically connected to the first terminal within the printed circuit board, the second terminal being arranged only in the first region and not in the second region.

Further features of the present invention will become apparent from the following description of exemplary embodiments with reference to the attached drawings.

BRIEF DESCRIPTION OF THE DRAWINGS

FIGS. 5A to 5F are diagrams illustrating a method for manufacturing the solid state apparatus according to the first embodiment;

DESCRIPTION OF THE EMBODIMENTS

Figure 1A:
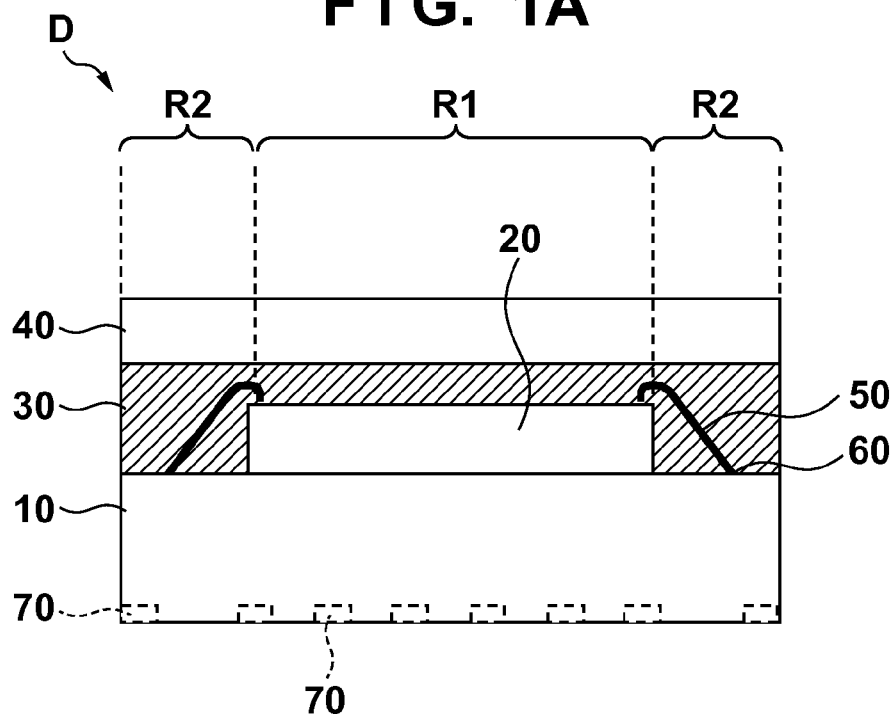
FIGS. 1A and 1B are diagrams illustrating the configuration of a conventional solid state apparatus.
Figure 1B:
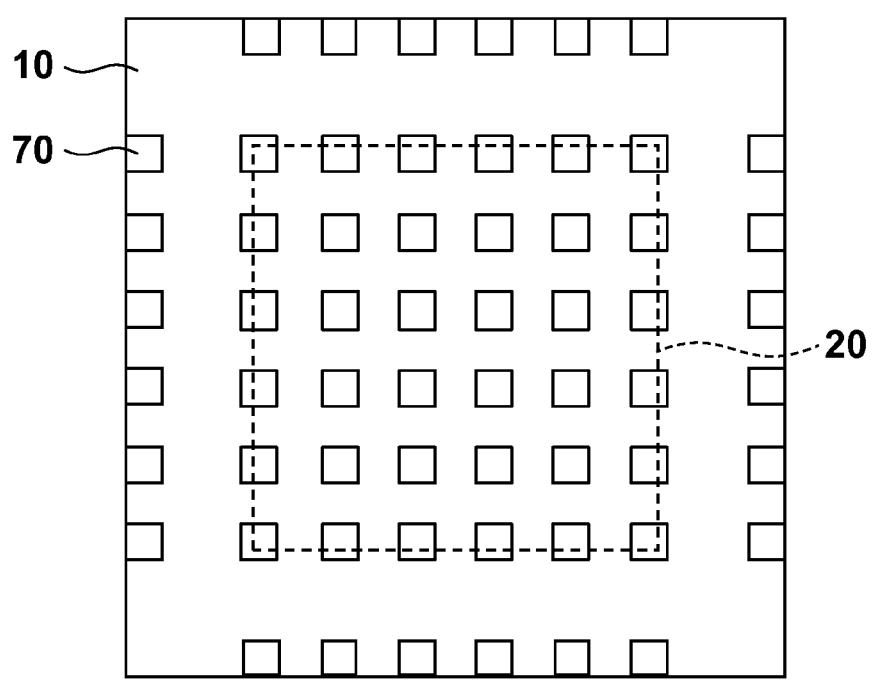

Prior to description of the embodiments of the present invention, the basic configuration of a solid state apparatus D will be discussed with reference to FIGS. 1A to 2C. FIG. 1A is a schematic cross-sectional view of the solid state apparatus D. FIG. 1B shows the solid state apparatus D viewed from below. The solid state apparatus D includes a printed circuit board 10, a semiconductor chip 20 for imaging, sealing resin 30, and a translucent member 40. The printed circuit board 10 is provided on its upper surface with first terminals 60 connected to the semiconductor chip 20 by a thin line 50, and on its lower surface with second terminals 70 electrically connected to the first terminals 60 within the printed circuit board 10.

Figure 2A:
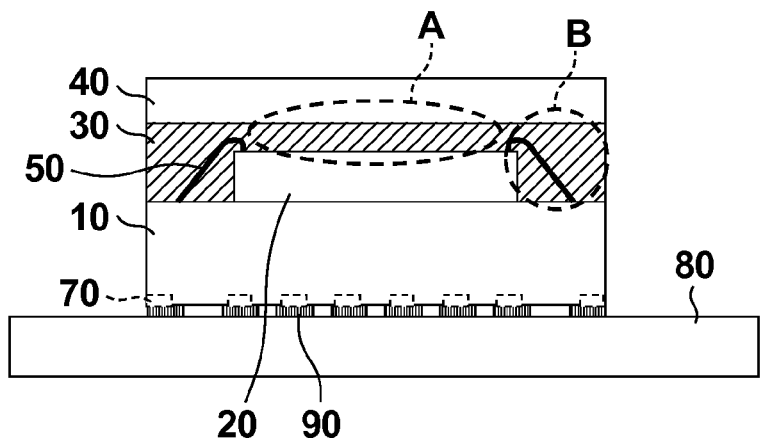
FIGS. 2A to 2C are diagrams illustrating states of the conventional solid state apparatus mounted on a mounting board.
Figure 2B:
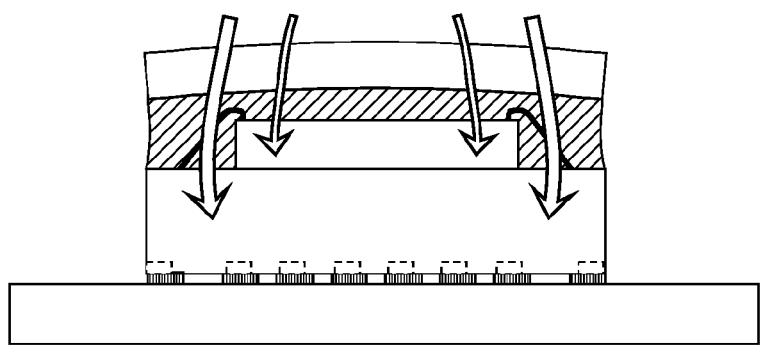
Figure 2C:
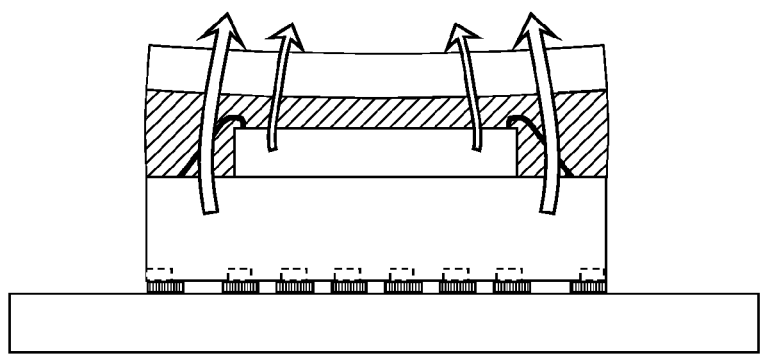

As shown in FIG. 2A, the second terminals 70 are fixed to a mounting board 80 by means of, for example, solder 90, and thus the solid state apparatus D is mounted on the mounting board 80. The solid state apparatus D is subjected to stress due to change in the environment such as, for example, temperature or humidity, and the translucent member 40 can be distorted as shown in FIGS. 2B and 2C. FIG. 2B shows a convexly distorted state of the translucent member 40 due to stress that occurs because the sealing resin 30 contracts as, for example, the temperature or the humidity decreases. The arrows in FIG. 2B schematically indicate the stress, and the size of these arrows indicates the magnitude of the stress. FIG. 2C shows a concavely distorted state of the translucent member 40 due to stress that occurs because the sealing resin 30 expands as, for example, the temperature or the humidity increases. Here, as shown in FIG. 2A, the sealing resin 30 is divided into a region A in the central portion and a region B that surrounds the region A. The above-mentioned phenomenon is caused because the sealing resin 30 in the region B becomes thicker than in the region A, and the variation in the volume of the sealing resin 30 in the region B due to contraction or expansion becomes larger than that in the region A. The embodiments that will be discussed below provide a solid state apparatus with high optical accuracy and high reliability by avoiding the distortion of the translucent member 40 that can be caused due to such stress.

First Embodiment

Figure 3A:
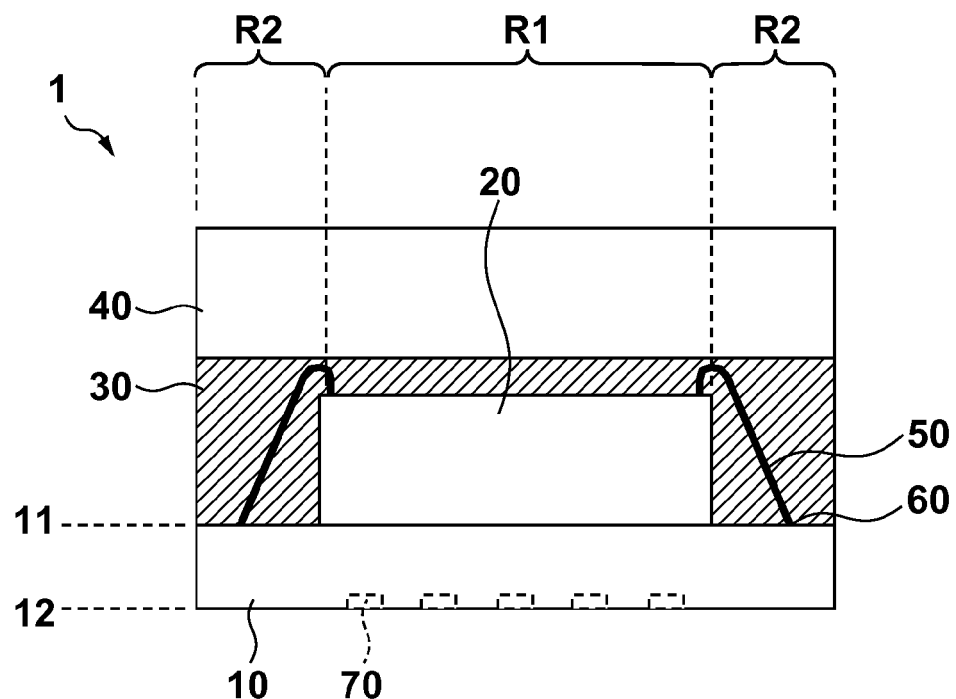
FIGS. 3A and 3B are diagrams illustrating the configuration of a solid state apparatus according to the first embodiment.
Figure 3B:
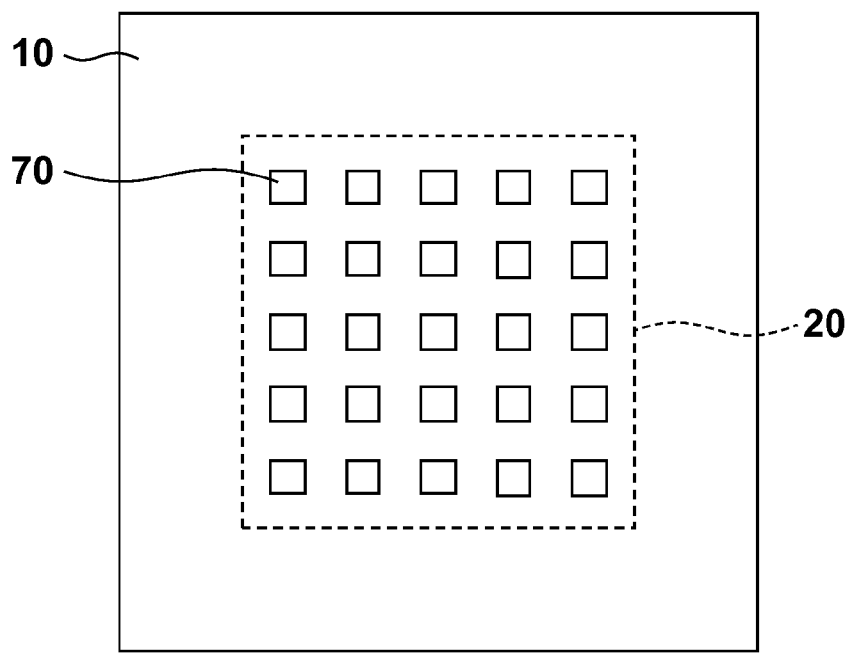

A solid state apparatus 1 in the first embodiment will be described with reference to FIGS. 3A to 5F. FIG. 3A is a schematic cross-sectional view of the solid state apparatus 1. FIG. 3B shows the solid state apparatus 1 viewed from below. The solid state apparatus 1 can include a printed circuit board 10, a semiconductor chip 20 for imaging, sealing resin 30, and a translucent member 40. The printed circuit board 10 has a first surface 11 and a second surface 12 that are opposite surfaces. The printed circuit board 10 may be a monolayer board having a single conductive layer, but may also be a double-sided board with conductive layers on two sides, or a multilayer board having a plurality of conductive layers. The printed circuit board 10 can be provided with first terminals 60 and second terminals 70 at which the conductive layers are exposed on the first surface 11 and the second surface 12, respectively. The first terminals 60 and the second terminals 70 are electrically connected to each other within the printed circuit board 10.

The semiconductor chip 20 for imaging can be arranged on the first surface 11 of the printed circuit board 10. The semiconductor chip 20 for imaging is provided with a semiconductor device including a pixel array, specifically a plurality of pixels arrayed on a semiconductor member, and a processing unit for processing signals output by the pixel array. This semiconductor device can be, for example, a CMOS image sensor or a CCD image sensor. The semiconductor chip 20 also has external terminals (not shown), which can be electrically connected to the first terminals 60 of the printed circuit board 10 with the thin line 50.

The sealing resin 30 is arranged so as to cover the printed circuit board 10 and the semiconductor chip 20, and is able to protect the semiconductor chip 20 and the thin line 50 from the external environment. Here, the sealing resin 30 may have an opening between the semiconductor chip 20 and the translucent member 40, as in the third to fifth embodiments that will be discussed later. The present embodiment (FIGS. 3A to 5F) shows the case of not having an opening.

The translucent member 40 is a member arranged over the sealing resin 30. The translucent member 40 has translucency so as to absorb light that enters the pixels in the semiconductor chip 20. It is desirable that the upper and lower surfaces of the translucent member 40 are flat and parallel to each other so that the image captured by the semiconductor chip 20 is not distorted. It is also desirable that the translucent member 40 causes little loss of light due to defects, foreign particles, or the like.

Here, the solid state apparatus 1 has, on its horizontal plane, a first region R1 located inward of the outer edge of the semiconductor chip 20 and a second region R2 located outward of the outer edge. The second terminals 70 of the printed circuit board 10 are arranged only in the first region R1 and not in the second region R2 in the second surface 12. The "horizontal plane" refers to a plan layout, that is, for example, a projected plan of members on a plane including, and parallel to, the surface of the semiconductor chip 20. The outer edge of the second terminals 70 may be in contact with the boundary between the first region R1 and the second region R2.

Figure 4A:
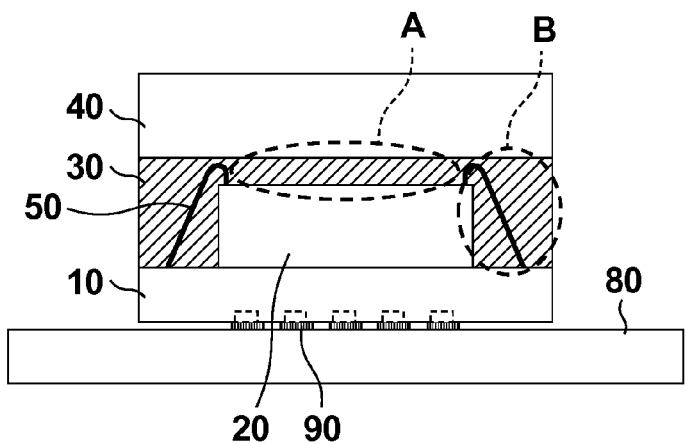
FIGS. 4A to 4C are diagrams illustrating states of the solid state apparatus according to the first embodiment mounted on a mounting board.
Figure 4B:
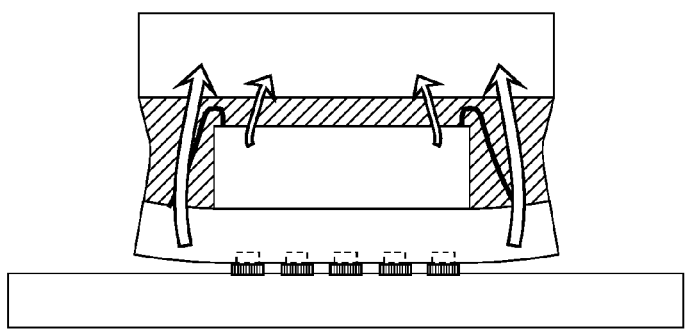

FIG. 4A shows a state of the solid state apparatus 1 fixed onto the mounting board 80. Specifically, the second terminals 70 of the printed circuit board 10 can be connected to terminals (e.g., solder land) of the mounting board 80 with the solder 90. FIG. 4B shows a state in which the volume of the sealing resin 30 contracts from the state shown in FIG. 4A. As already stated, the sealing resin 30 is divided into the region A in the central portion and the region B that surrounds the region A. Stress can be caused because the sealing resin 30 is thicker in the region B than in the region A and the variation of the volume due to contraction of the sealing resin 30 becomes larger in the region B than in the region A. At this time, the second terminals 70 of the printed circuit board 10 are arranged only in the first region R1 and not in the second region R2 of the second surface 12. Therefore the second region R2 of the printed circuit board 10 can be bent.

In the case of the solid state apparatus D, as already shown in FIG. 2B, the second terminals 70 are fixed to the mounting board 80 with the solder 90 in the first region R1 and the second region R2. Hence, in the solid state apparatus D, the second region R2 of the printed circuit board 10 is not flexible, and the translucent member 40 is subjected to a large amount of stress as a result of volume contraction of the sealing resin 30.

On the other hand, in the solid state apparatus 1 in the present embodiment, the second terminals 70 are fixed to the mounting board 80 with the solder 90 only in the first region R1 and not in the second region R2, unlike in the solid state apparatus D. That is, the second region R2 of the printed circuit board 10 is not fixed to the mounting board 80, and is therefore flexible. Thus the solid state apparatus 1 can maintain the translucent member 40 in a flat state, as shown as an example in FIG. 4B.

Figure 4C:
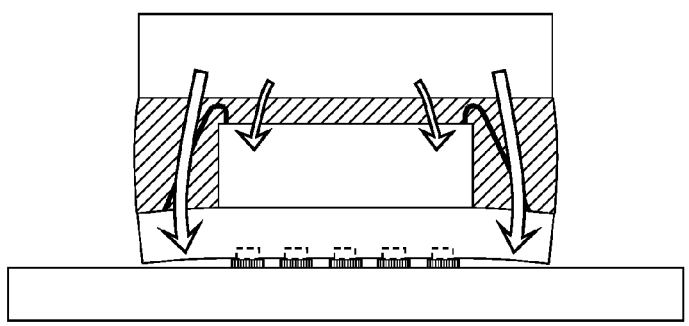

Meanwhile, FIG. 4C shows a state in which the volume of the sealing resin 30 expands from the state shown in FIG. 4A. This state can cause an opposite phenomenon to that occurring when the volume of the sealing resin 30 contracts as mentioned above, while the solid state apparatus 1 can maintain the translucent member 40 in a flat state, as shown as an example in FIG. 4C, for the same reason.

As discussed above, with the solid state apparatus 1 in the present embodiment, distortion of the translucent member 40 can be avoided. Thus image distortion or focus shift at the time of imaging can be prevented, resulting in improved optical accuracy of the solid state apparatus 1. Furthermore, it is possible to prevent problems of electrical contact such as a short circuit or a break caused by the stress on the thin line 50, and therefore to improve the reliability of the solid state apparatus 1.

Here, if the printed circuit board 10 is a double-sided or multi-layer board, through-holes or vias are provided in the conductive layers to enable the conductive layers to be electrically connected with one another. In this case, it is desirable to arrange the through-holes or the vias in the first region R1. This is because the portion of the printed circuit board 10 to which the through-holes or the vias are provided becomes less flexible, that is, the modulus of elasticity in bending becomes higher. Meanwhile, as an insulating layer of the printed circuit board 10, prepreg prepared by impregnating glass fiber with epoxy resin can be generally used. The prepreg can be one of FR-4, FR-5, and BT resin, which have a high flame-retardant grade. It is desirable that the thickness of the printed circuit board 10 is about 0.05 to 0.2 mm. This is because the prepreg has a high modulus of elasticity in bending of about 15 to 25 GPa, and the printed circuit board 10 thus becomes less flexible. Meanwhile, a flexible printed circuit board having an insulating layer composed of polyimide or PET is sufficiently flexible, and can therefore be used as the printed circuit board 10.

It is desirable that the semiconductor chip 20 has the thickness of about 0.25 to 1.0 mm. This is for the purpose of securing the rigidity of the semiconductor chip 20 since the printed circuit board 10 can be bent, as mentioned above. Here, as the semiconductor chip 20 is thicker, and as the sealing resin 30 is thicker in the region A than in the region B, the above-mentioned stress is more significant. The sealing resin 30 is, for example, one of acryl, epoxy, and silicone resin that do not contain filler, and can be thermosetting or UV-cured resin. Particularly, UV-cured acrylic resin is suitable because of its high translucence. The translucent member 40 can be, for example, inorganic material such as glass or crystal. As for glass, borosilicate glass that emits a small amount of alpha rays can be used suitably. The above-mentioned types of material have a relatively high modulus of elasticity in bending of about 60 to 80 GPa, and therefore the desirable thickness of the translucent member 40 is about 0.3 to 0.7 mm. The second terminals 70 may protrude downward from the second surface 12 of the printed circuit board 10, or may be arranged above the second surface 12. The surface of the second terminals 70 may be gilded or tinned in order to improve solderability. Alternatively, a solder ball may be attached to each second terminal 70. Moreover, a solder resist can be provided between the second terminals 70 to prevent a short circuit between the terminals caused by soldering.

Hereinafter, an exemplary method for manufacturing the solid state apparatus 1 will be described with reference to FIG. 5. The solid state apparatus 1 can be manufactured through the first to sixth processes that will be discussed below. FIGS. 5A to 5F correspond to the first to sixth processes, respectively. In the first process, as shown in FIG. 5A, a printed circuit board (hereinafter referred to as "board") $10A_1$ can be prepared. This board $10A_1$ can be manufactured by known techniques, and a plurality of circuit patterns (not shown) are formed on the same board. This "circuit pattern" refers to a predetermined circuit pattern provided on the printed circuit board 10 shown as an example in FIGS. 3 and 4.

In the second process, as shown in FIG. 5B, a plurality of the semiconductor chips 20 for imaging can be fixed at predetermined positions on the board $10A_1$. Thereafter the semiconductor chips 20 can be electrically connected to the respective circuit patterns formed on the board $10A_1$. The semiconductor chips 20 can be fixed on the board $10A_1$ using, for example, known die-bonding equipment. Specifically, for example, thermosetting resin (not shown) can be applied to predetermined positions on the upper surface of the board $10A_1$ by means of dispensing or transferring the resin. Thereafter, the semiconductor chips 20 can be placed thereon, and fixed onto the board $10A_1$ by curing the thermosetting resin using an oven. Furthermore, the semiconductor chips 20 can be then electrically connected to the respective circuit patterns formed on the board $10A_1$ using known wire-bonding equipment. Specifically, the external terminals of each semiconductor chip 20 can be connected to the first terminals 60 of the printed circuit board 10 shown in FIG. 4 by the thin line 50. The thin line 50 has a diameter of, for example, 15 to 30 μm, and can be a thin line composed of metal such as gold, silver, copper, or aluminum. Through the above-described processes, it is possible to obtain a board $10A_2$ on which the plurality of circuit patterns formed on the board $10A_1$ are electrically connected to the respective semiconductor chips 20.

In the third process, as shown in FIG. 5C, outer edge resin 30E is provided along the outer edge of the board $10A_2$, thereby obtaining a board $10A_3$. This outer edge resin 30E serves as a support for supporting the translucent member 40 that will be provided later, and also as a barrier for preventing the sealing resin 30 from flowing out at the time of injection thereof, as described later. In the fourth process, as shown in FIG. 5D, the plate-shaped translucent member 40 can be provided over the entire board $10A_3$. The translucent member 40 can be supported by the outer edge resin 30E. Thereafter the outer edge resin 30E can be cured by, for example, UV-curing. Thus a board $10A_4$ can be obtained. In the fifth process, as shown in FIG. 5E, the sealing resin 30 can be injected between the board $10A_4$ and the translucent member 40. The sealing resin 30 can be injected through, for example, holes (not shown) provided in advance in the board $10A_1$. Thereafter the sealing resin 30 can be cured by, for example, UV-curing. Thus a board $10A_5$ can be obtained. In the sixth process, as shown in FIG. 5F, the board $10A_5$ can be cut into the individual solid state apparatuses 1 using known dicing equipment. Through the above-described processes, each solid state apparatus 1 can be obtained.

Second Embodiment

The optical accuracy and reliability of the solid state apparatus 1 discussed in the first embodiment can be further improved by appropriately choosing parameters concerning the material or structure. Let the thickness of the printed circuit board 10 be tp (m), the modulus of elasticity in bending thereof be Ep (Pa), the thickness of the translucent member 40 be tt (m), and the modulus of elasticity in bending thereof be Et (Pa). Here, it is desirable that the relationship expressed as $tp^3 \times Ep < tt^3 \times Et$ is satisfied. Here, the modulus of elasticity in bending is the one measured by the method described in JIS K 6911. When the above relationship is satisfied, the printed circuit board 10 is more flexible than the translucent member 40, and the same advantageous effect as in the first embodiment can be achieved more efficiently. Particularly, the relationship expressed as $10 \times tp^3 \times ep < tt^3 \times Et$ results in the printed circuit board 10 being ten times more flexible than the translucent member 40. Accordingly, it is possible to easily prevent distortion of the translucent member 40 without taking account of the types or characteristic variation of the material used for the sealing resin 30.

As discussed above, for the solid state apparatus 1, the parameters concerning the material or structure can be appropriately chosen based on the above expression. Thus the same advantageous effect as in the first embodiment can be achieved more efficiently, and the optical accuracy and reliability of the solid state apparatus 1 can be further improved.

Third Embodiment

Figure 6A:
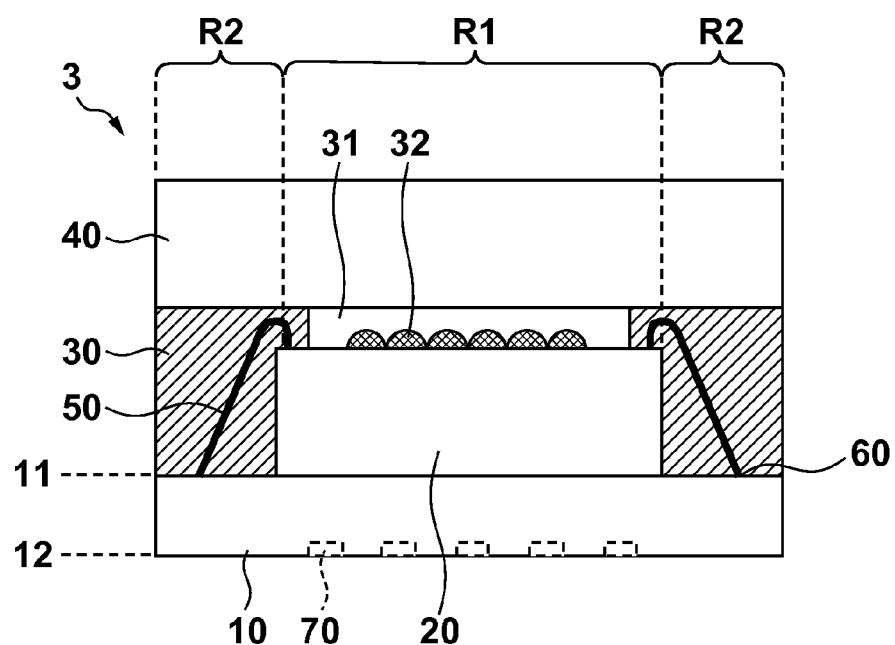
FIGS. 6A and 6B are diagrams illustrating the configuration of a solid state apparatus according to the third embodiment.
Figure 6B:
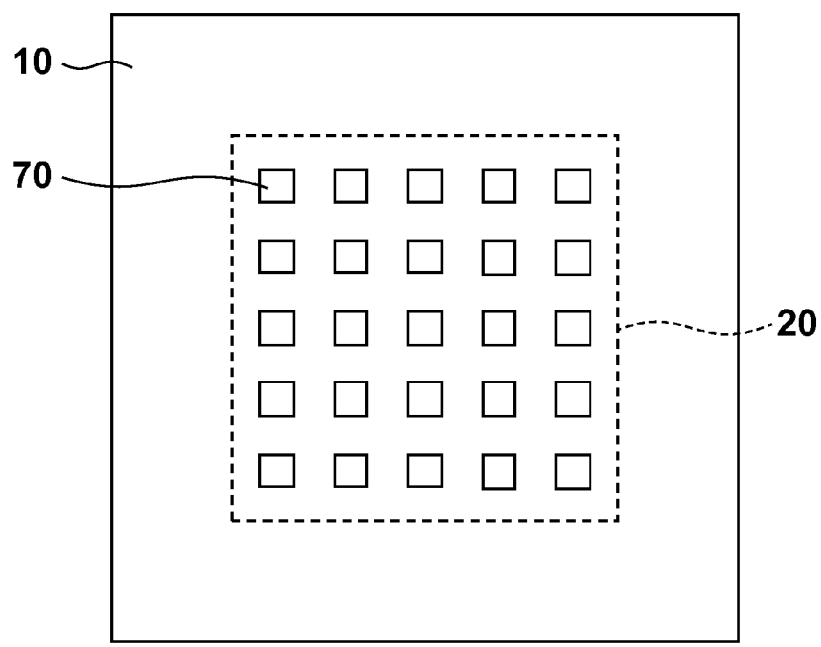

A solid state apparatus 3 in the third embodiment will be described with reference to FIGS. 6A to 7G. In the solid state apparatus 3, the sealing resin 30 may have an opening 31 between the semiconductor chip 20 and the translucent member 40, as shown in FIG. 6A. The solid state apparatus 3 can be provided with microlenses 32 in the opening 31. In this case, the sealing resin 30 is arranged outside the optical path of incident light, and may therefore contain filler such as silica or alumina. FIG. 6B shows the solid state apparatus 3 viewed from below. The second terminals 70 of the printed circuit board 10 are arranged only in the first region R1 and not in the second region R2 of the second surface 12. In the present embodiment as well, the same advantageous effect as in the first embodiment can be achieved, and the optical accuracy and reliability of the solid state apparatus 3 can be improved.

Figure 7A:
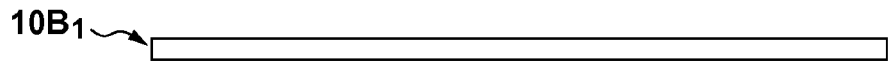
FIGS. 7A to 7G are diagrams illustrating a method for manufacturing the solid state apparatus according to the third embodiment.
Figure 7B:
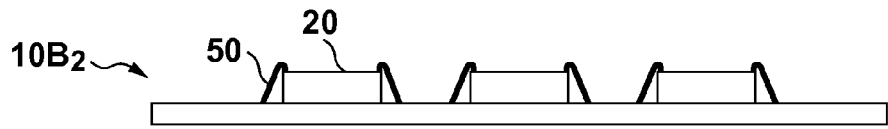
Figure 7C:
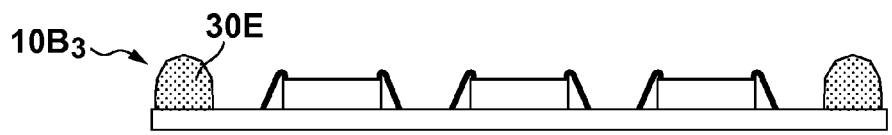

Hereinafter, an exemplary method for manufacturing the solid state apparatus 3 will be described with reference to FIGS. 7A to 7G. The solid state apparatus 3 can be manufactured through the first to seventh processes that will be discussed below. FIGS. 7A to 7G correspond to the first to seventh processes, respectively. As shown in FIGS. 7A to 7C, the first to third processes are implemented in the same manner as shown in FIGS. 5A to 5C, and thus a board $10B_3$ can be obtained.

Figure 7D:
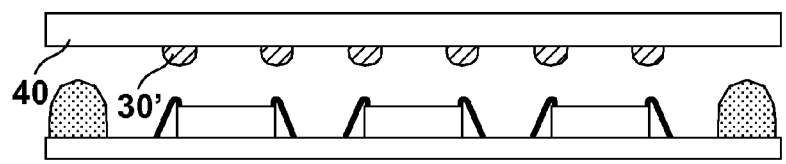
Figure 7E:
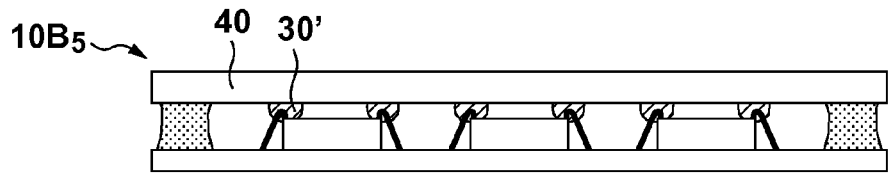
Figure 7F:
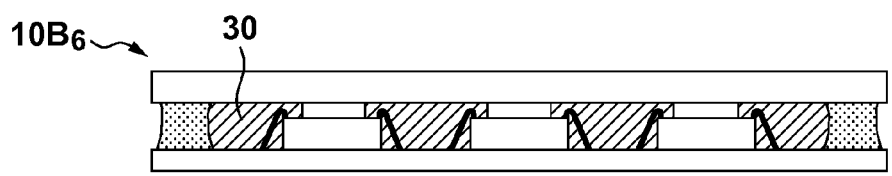
Figure 7G:
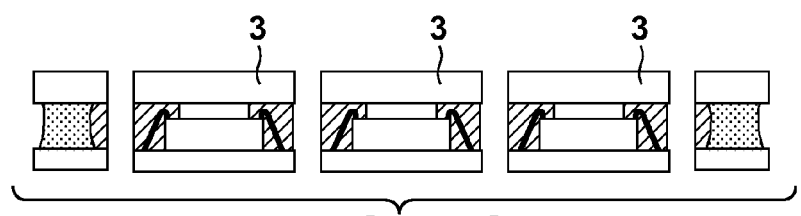

In the fourth process, as shown in FIG. 7D, the sealing resin 30' can be provided in predetermined positions on the lower surface of the translucent member 40. In the fifth process, as shown in FIG. 7E, the plate-shaped translucent member 40 with the sealing resin 30' provided in the fourth process can be placed over the board $10B_3$. At this time, the translucent member 40 can be supported by the outer edge resin 30E. Thereafter the outer edge resin 30E can be cured by, for example, UV-curing. Thus a board $10B_5$ can be obtained. At this time, the sealing resin 30' provided in the fourth process can be located along the external terminals of each semiconductor chip 20. In the sixth process, as shown in FIG. 7G, the sealing resin 30 can be injected between the board $10B_5$ and the translucent member 40. The sealing resin 30 can be injected through, for example, holes (not shown) provided in advance on the board $10B_1$. Thereafter the sealing resin 30 can be cured by, for example, UV-curing. Thus a board $10B_6$ can be obtained. In the seventh process, as shown in FIG. 7F, the board $10B_6$ can be cut into the individual solid state apparatuses 3 using known dicing equipment. Through the above-described processes, each solid state apparatuses 3 can be obtained.

The solid state apparatus 3 can be obtained also by the manufacturing method that will be described next, as well as the one discussed above. That is, in the fourth process after the first to third processes, the sealing resin 30' can be provided along the external terminals of each semiconductor chip 20 on the board $10B_3$, thereby obtaining the board $10B_4$. After that, in the fifth process, the plate-shaped translucent member 40 is provided over the entire board $10B_4$, and thus the same board $10B_5$ as the one described above can be obtained. Thereafter, the sixth and seventh processes can be implemented. The solid state apparatus 3 can be obtained by this method as well.

Fourth Embodiment

Figure 8A:
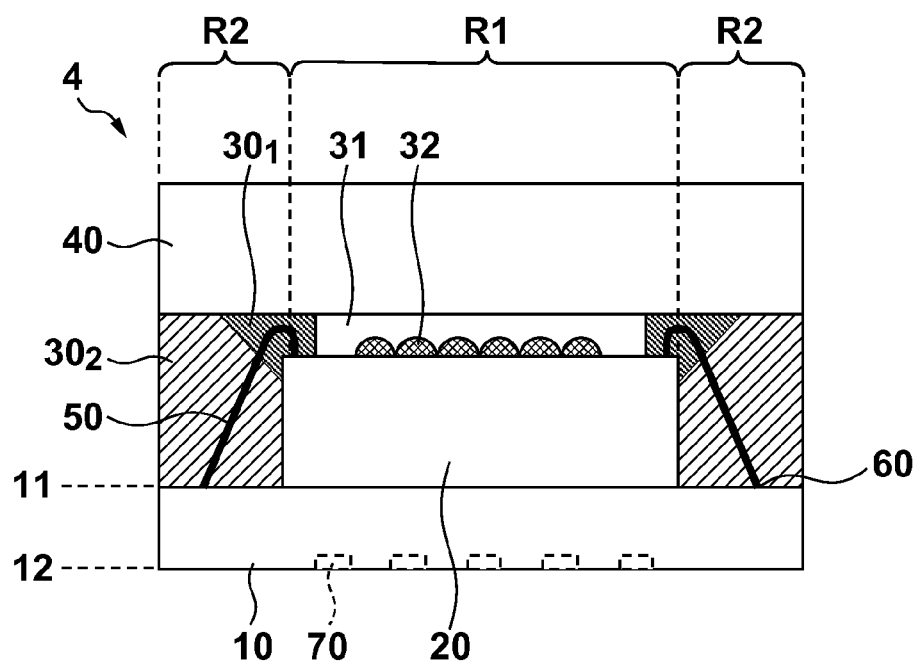
FIGS. 8A and 8B are diagrams illustrating the configuration of a solid state apparatus according to the fourth embodiment.
Figure 8B:
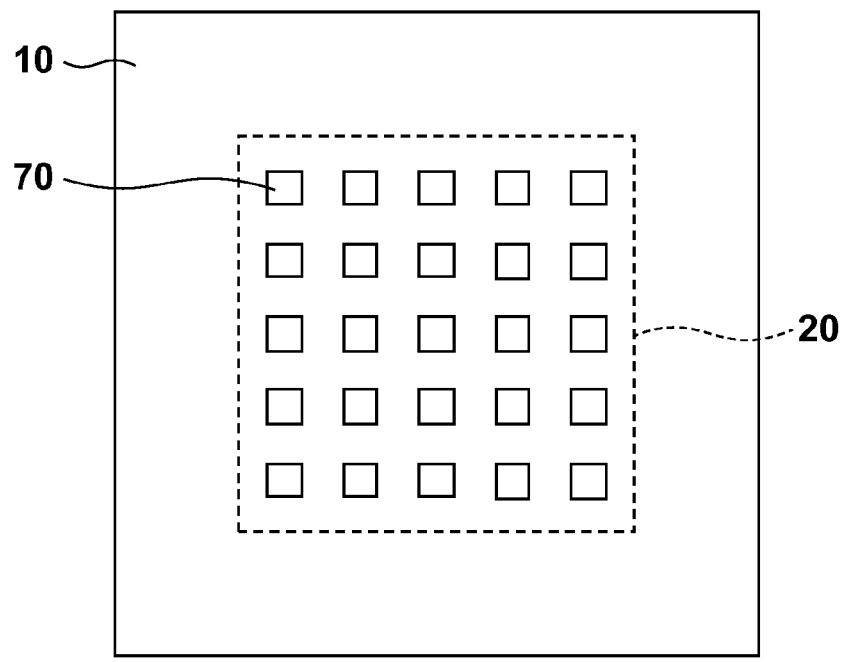

A solid state apparatus 4 in the fourth embodiment will be described with reference to FIGS. 8A to 9C. In the solid state apparatus 4, as shown as an example in FIG. 8A, the sealing resin 30 includes a first sealing resin $30_1$ arranged in the central portion and a second sealing resin $30_2$ arranged in a portion surrounding the central portion, which is the difference from the third embodiment. Here, the first sealing resin $30_1$ has a smaller elasticity modulus than that of the second sealing resin $30_2$. FIG. 8B shows the solid state apparatus 4 viewed from below.

Figure 9A:
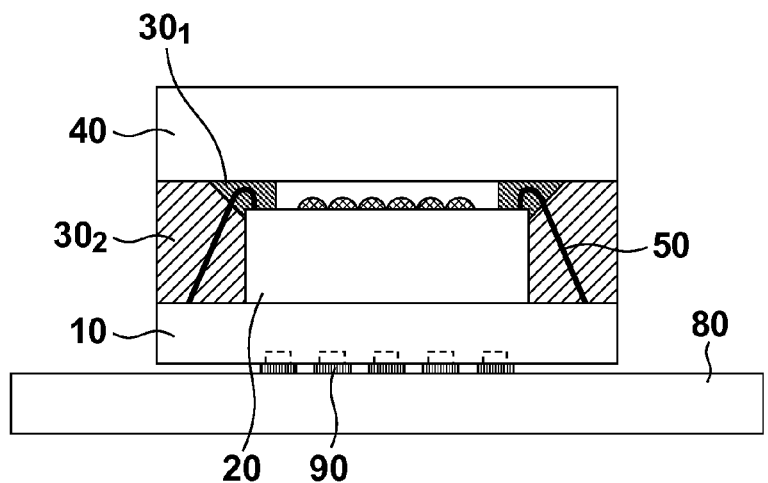
FIGS. 9A to 9C are diagrams illustrating states of the solid state apparatus according to the fourth embodiment mounted on a mounting board.
Figure 9B:
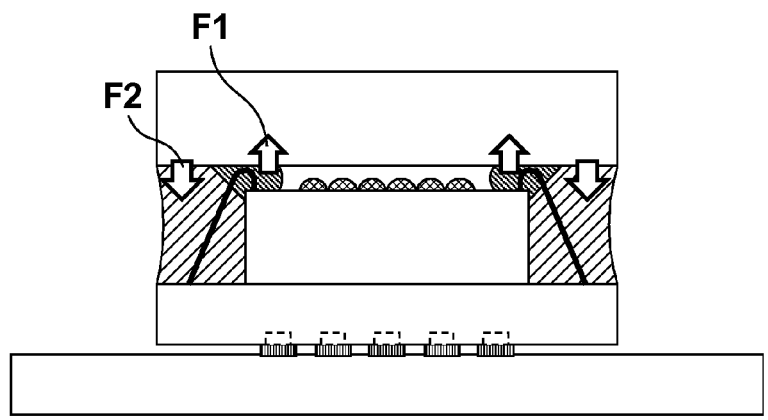

FIG. 9A shows a state of the solid state apparatus 4 fixed onto the mounting board 80. FIG. 9B shows a state in which the volume of the first sealing resin $30_1$ and the second sealing resin $30_2$ contracts from the state shown in FIG. 9A. The second sealing resin $30_2$ is thicker than the first sealing resin $30_1$. Therefore, the variation of the volume of the second sealing resin $30_2$ due to the contraction is larger than that of the first sealing resin $30_1$. Accordingly, as shown by arrows F1 in FIG. 9B, the first sealing resin $30_1$ can be subjected to the force that presses the first sealing resin $30_1$ from the translucent member 40. That is, in the region A of the translucent member 40, force F1 that pushes the translucent member 40 upward can work in the portion in which the first sealing resin $30_1$ is in contact with the translucent member 40. Meanwhile, the second sealing resin $30_2$ can be subjected to the force that pulls the second sealing resin $30_2$ from the translucent member 40, as shown by arrows F2 in FIG. 9B. That is, in the region B of the translucent member 40, force F2 that pulls back the translucent member 40 downward can work in the portion in which the second sealing resin $30_2$ in the region B is in contact with the translucent member 40. That is, the upward force F1 is applied to the translucent member 40 in the region A, the downward force F2 is applied thereto in the region B, and the stress thus caused can convexly distort the translucent member 40. At this time, if the elasticity modulus of the first sealing resin $30_2$ is smaller than that of the second sealing resin $30_2$, this stress can be smaller. Thus the solid state apparatus 4 can maintain the translucent member 40 in a flat state, as shown in FIG. 9B.

Figure 9C:
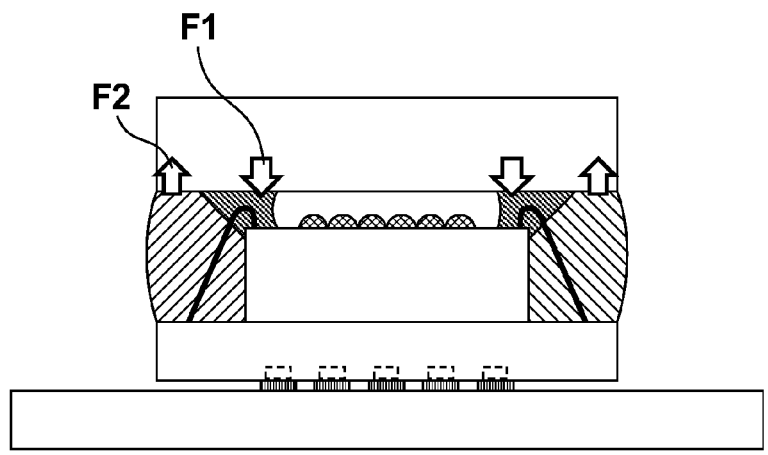

Meanwhile, FIG. 9C shows a state in which the volume of the first sealing resin $30_2$ and the second sealing resin $30_2$ expands from the state shown in FIG. 9A. This state can cause an opposite phenomenon to that occurring when the volume of the first sealing resin $30_2$ and the second sealing resin $30_2$ contracts. That is, the downward force F1 is applied to the translucent member 40 in the region A, the upward force F2 is applied thereto in the region B, and the stress thus caused can concavely distort the translucent member 40. However, similarly to the above-mentioned case, if the elasticity modulus of the first sealing resin $30_2$ is smaller than that of the second sealing resin $30_2$, this stress can be smaller. Thus the solid state apparatus 4 can maintain the translucent member 40 in a flat state, as shown as an example in FIG. 9C.

Particularly, the optical accuracy and reliability of the solid state apparatus 4 can be further improved by appropriately choosing parameters concerning the material or structure. Let the elasticity modulus of the first sealing resin $30_2$ be E1 (Pa), the elasticity modulus of the second sealing resin $30_2$ be E2 (Pa), the area in which the first sealing resin $30_2$ is bonded with the semiconductor chip 20 be S1 (m²), and the area in which the second sealing resin $30_2$ is bonded with the printed circuit board 10 be S2 (m²). And let the distance between the semiconductor chip 20 and the translucent member 40 be g1 (m), and the distance between the printed circuit board 10 and the translucent member 40 be g2 (m). Here, it is more desirable that the relationship expressed as $E1 \cdot S1/g1 < E2 \cdot S2/g2$ is satisfied.

Thus, with the solid state apparatus 4 the same advantageous effect as in the third embodiment can be achieved more efficiently, and the optical accuracy and reliability of the solid state apparatus 4 can be further improved. Furthermore, in the region A, it is desirable to provide only the first sealing resin $30_1$ and not to provide the second sealing resin $30_2$. This is because, if the second sealing resin $30_2$ having a higher elasticity modulus than that of the first sealing resin $30_1$ is located in the region A, the above-mentioned stress becomes larger and causes distortion of the translucent member 40. Although in the present embodiment the first sealing resin $30_1$ has the opening 31 between the semiconductor chip 20 and the translucent member 40, the same advantageous effect can be achieved even without the opening 31.

Hereinafter, an exemplary method for manufacturing the solid state apparatus 4 will be described. The solid state apparatus 4 can be manufactured by changing the fourth and sixth processes among the first to seventh processes described in the third embodiment. That is, as for the fourth process (FIG. 7D), the sealing resin 30' applied on the lower surface of the translucent member 40 is replaced with the first sealing resin $30_1$. As for the sixth process (FIG. 7F), the sealing resin 30 injected between the translucent member 40 and the printed circuit board 10 is replaced with the second sealing resin $30_2$.

The four embodiments have been described above, but the present invention is not limited thereto. Needless to say, the purpose, state, use, function, and any other specifications of the present invention can be appropriately modified, and implemented in other embodiments as well.

Here, as an exemplary application of the solid state apparatus according to each of the above-described embodiments, a camera that incorporates this solid state apparatus is described. The concept of a camera includes not only an apparatus mainly for imaging, but also an apparatus equipped with an auxiliary imaging function (e.g., a personal computer or a mobile terminal). The camera includes the solid state apparatus according to the present invention, whose examples have been described in the above embodiments, and a processing unit that processes signals output by the solid state apparatus. The processing unit can include, for example, an A/D converter and a processor that processes digital data output by the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-264114, filed Dec. 1, 2011, which is hereby incorporated by reference herein in its entirety.

What is claimed is:

1. A solid state apparatus comprising:
a printed circuit board having a first surface and a second surface that are opposite surfaces;
a semiconductor chip for imaging arranged on the first surface of the printed circuit board;
a sealing resin arranged to cover the printed circuit board and the semiconductor chip; and
a translucent member arranged on the sealing resin,
the solid state apparatus having a first region located only inward of an outer edge of the semiconductor chip in a planar view against the first surface, and a second region located outward of the outer edge in the planar view,
the printed circuit board comprising, on the first surface, a first terminal electrically connected to the semiconductor chip, and comprising, on the second surface, a second terminal electrically connected to the first terminal within the printed circuit board,
the second terminal being arranged only in the first region and not in the second region.

2. The solid state apparatus according to claim 1, wherein,
a thickness tp (m) of the printed circuit board,
a modulus of elasticity in bending Ep (Pa) of the printed circuit board,
a thickness tt (m) of the translucent member, and
a modulus of elasticity in bending Et (Pa) of the translucent member,
satisfy the following expression;

$$tp3 \times Ep < tt3 \times Et.$$

3. The solid state apparatus according to claim 1, wherein the printed circuit board comprises a plurality of conductive layers, and a through-hole or a via that connects the plurality of conductive layers with one another, and
the through-hole or the via is arranged only in the first region and not in the second region.

4. The solid state apparatus according to claim 1, wherein the sealing resin includes a first sealing resin arranged in a central portion, and a second sealing resin arranged in a portion that surrounds the central portion, and
the first sealing resin has a smaller elasticity modulus than that of the second sealing resin.

5. The solid state apparatus according to claim 4, wherein an elasticity modulus E1 (Pa) of the first sealing resin,
an elasticity modulus E2 (Pa) of the second sealing resin,
an area in which the first sealing resin is bonded with the semiconductor chip S1 (m2),
an area in which the second sealing resin is bonded with the printed circuit board S2 (m2),
a distance between the semiconductor chip and the translucent member g1 (m), and
a distance between the printed circuit board and the translucent member g2 (m),
satisfy the following expression;

$$E1 \cdot S1/g1 < E2 \cdot S2/g2.$$

6. A camera comprising:
the solid state apparatus according to claim 1; and
a processing unit that processes a signal output by the solid state apparatus.

7. A solid state apparatus comprising:
a printed circuit board having a first surface and a second surface that are opposite surfaces;
a semiconductor chip for imaging arranged on the first surface of the printed circuit board;
a sealing resin arranged to cover the printed circuit board and the semiconductor chip; and
a translucent member arranged on the sealing resin,
the solid state apparatus having a first region located inward of an outer edge of the semiconductor chip, and a second region located outward of the outer edge,
the printed circuit board comprising, on the first surface, a first terminal electrically connected to the semiconductor chip, and comprising, on the second surface, a second terminal electrically connected to the first terminal within the printed circuit board,
the second terminal being arranged only in the first region and not in the second region,
wherein, a thickness tp (m) of the printed circuit board,
a modulus of elasticity in bending Ep (Pa) of the printed circuit board,
a thickness tt (m) of the translucent member, and
a modulus of elasticity in bending Et (Pa) of the translucent member,
satisfy the following expression;

$$tp3 \times Ep < tt3 \times Et.$$

8. A solid state apparatus comprising:
a printed circuit board having a first surface and a second surface that are opposite surfaces;
a semiconductor chip for imaging arranged on the first surface of the printed circuit board;
a sealing resin arranged to cover the printed circuit board and the semiconductor chip; and
a translucent member arranged on the sealing resin,
the solid state apparatus having a first region located inward of an outer edge of the semiconductor chip, and a second region located outward of the outer edge,
the printed circuit board comprising, on the first surface, a first terminal electrically connected to the semiconductor chip, and comprising, on the second surface, a second terminal electrically connected to the first terminal within the printed circuit board,
the second terminal being arranged only in the first region and not in the second region,
wherein the sealing resin includes a first sealing resin arranged in a central portion, and a second sealing resin arranged in a portion that surrounds the central portion, and
the first sealing resin has a smaller elasticity modulus than that of the second sealing resin.

9. The solid state apparatus according to claim 8, wherein an elasticity modulus E1 (Pa) of the first sealing resin,
an elasticity modulus E2 (Pa) of the second sealing resin,
an area in which the first sealing resin is bonded with the semiconductor chip S1 (m2),
an area in which the second sealing resin is bonded with the printed circuit board S2 (m2), a distance between the semiconductor chip and the translucent member g1 (m), and
a distance between the printed circuit board and the translucent member g2 (m),
satisfy the following expression;

$$E1 \cdot S1/g1 < E2 \cdot S2/g2.$$

* * * * *